United States Patent [19]

Brittan

[11] Patent Number: 5,610,507
[45] Date of Patent: Mar. 11, 1997

[54] POWER CONTROL SWITCH

[75] Inventor: Steven J. Brittan, Hampshire, United Kingdom

[73] Assignee: GEC Marconi Ltd., Middlesex, United Kingdom

[21] Appl. No.: 223,509

[22] Filed: Apr. 6, 1994

[30] Foreign Application Priority Data

Apr. 16, 1993 [GB] United Kingdom .................. 9307921

[51] Int. Cl.$^6$ ........................................ G05F 1/10
[52] U.S. Cl. ........................ 323/350; 323/351; 323/272; 327/403; 327/401
[58] Field of Search ..................... 323/268, 269, 323/272, 289, 350, 351; 327/401, 403

[56] References Cited

U.S. PATENT DOCUMENTS

| 4,366,522 | 12/1982 | Baker ........................................ 361/91 |
| 4,547,686 | 10/1985 | Chen ........................................ 307/570 |
| 4,701,645 | 10/1987 | Ferguson .................................. 307/570 |
| 4,760,293 | 7/1988 | Hebenstreit ............................... 307/570 |
| 5,030,844 | 7/1991 | Li et al. ..................................... 361/58 |
| 5,099,383 | 3/1992 | Fukano et al. ............................ 323/272 |

FOREIGN PATENT DOCUMENTS

| 0245769 | 11/1987 | European Pat. Off. . |
| 0272898 | 6/1988 | European Pat. Off. . |
| 0443155A1 | 8/1991 | European Pat. Off. . |
| 0502715 | 9/1992 | European Pat. Off. . |
| 0502715A1 | 9/1992 | European Pat. Off. . |

OTHER PUBLICATIONS

*Elektronik*, vol. 39, No. 23, Nov. 1, 1990, Munchen, DE, pp. 62–67, W. Bosterling et al. "Optimierte Leistungssteuerung".

The 70KHZ IGBT, PCIM Europe, May/Jun. 1991, pp. 150–156, by Matthew Carter.

Field–Programmable Gate–Arrays and Semi–Custom Designs for Sinusoidal and Current–Regulated PWM, IEE Coloquium on Asic Technology for Power Electronics Equipment, Feb. 20, 1992, London pp. 1–4, Green et al.

Efficient High–Frequency Soft Switched Power Converter with Signal Processor Control, Intelec 1991 Conference Proceedings Kyoto, Japan, 5–8 Nov. 1991, pp. 631–639.

A Gate Array Design for PWM Inverter Control, 3rd European Conference on Power Electronics and Applications, Oct. 9–12, 1989, AACHEN pp. 521–526,

*Primary Examiner*—Peter S. Wong
*Assistant Examiner*—Shawn Riley
*Attorney, Agent, or Firm*—Donald C. Casey, Esq.

[57] ABSTRACT

According to a first aspect of the invention, a power control switch comprises two solid state switching elements (14, 15) in parallel, the second switching element (15) having a higher resistance but faster turn-off time than the first element. In operation the switch is pulse width modulated and the first element is switched off after the second element to establish a guard period, the duration of which is controlled in dependence upon the duty cycle to provide efficient switching. According to a second aspect of the invention a power control switch comprises a switching element (14 or 15) controlled by a field programmable gate array (5) which is preferably programmed by an erasable programmable read only memory (EPROM), thereby providing a reconfigurable control means.

15 Claims, 2 Drawing Sheets

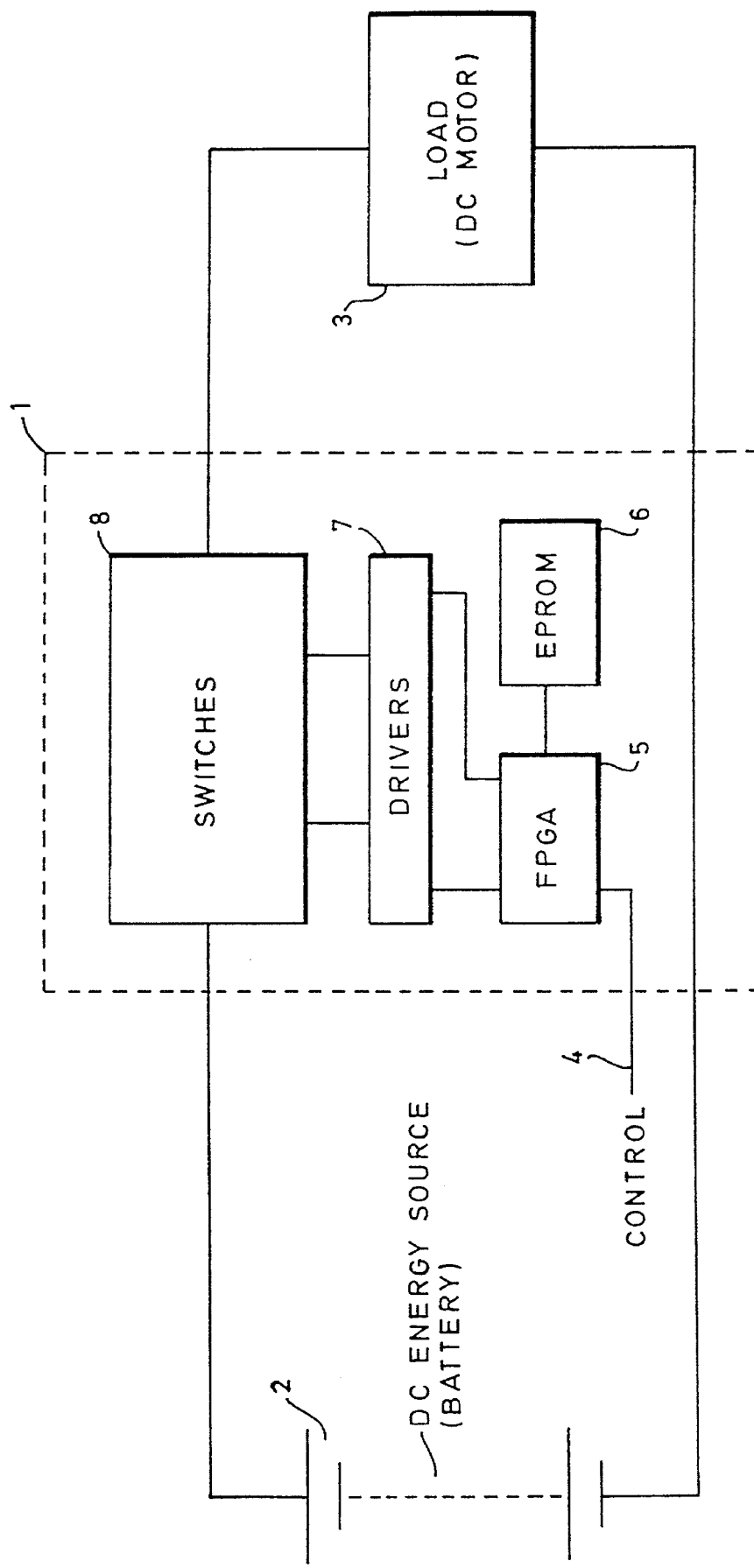

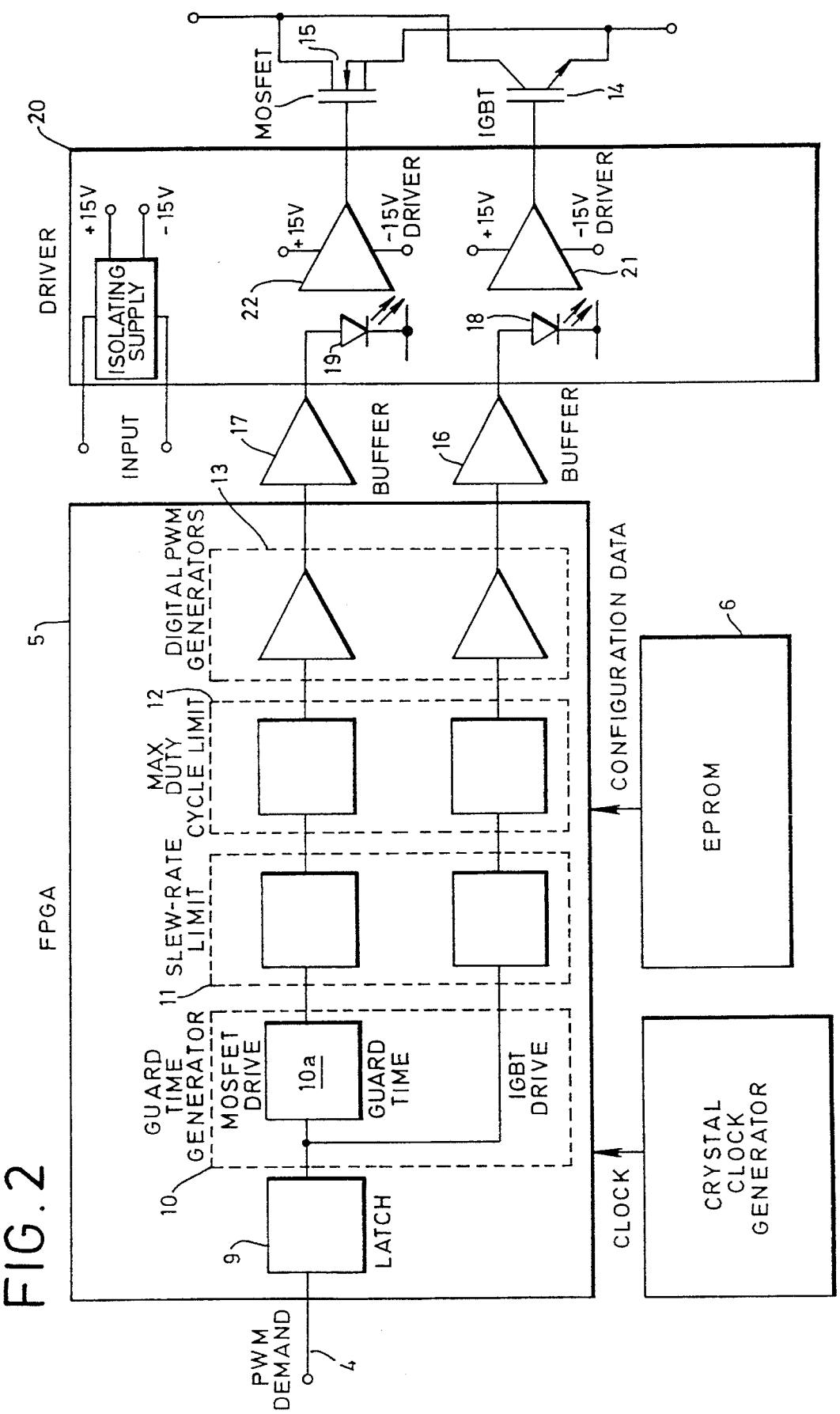

POWER CONTROL SWITCH

BACKGROUND OF THE INVENTION

This invention relates to a power control switch of the type employing a solid state switching element.

Power switches for DC applications commonly use pulse width modulation. In its simplest form this comprises the power switch being driven at a particular frequency, with the switching element switched to an "on" position for a certain proportion of each cycle, the duty cycle, in which the energy transmitted depends on the proportion of the cycle for which the switching element is in the "on" position. Pulse width modulation is commonly achieved by using a comparator to compare a sawtooth waveform with a reference voltage and applying the comparator output via buffering to the base of a bipolar transistor. The duty cycle can be increased or decreased by varying the reference voltage such that the proportion of each cycle for which the reference voltage is exceeded is correspondingly increased or decreased.

In certain power switching applications it is important that the switch be efficient for one of two reasons. The first reason is that if the switch is inefficient then considerable heat is generated within the switch, which reduces the power handling capability of the switching element and/or requires heat sinking for the switching element and consequent heat exchanging apparatus, which can substantially dictate the size of the switch. Secondly, in some DC applications the power is supplied by a finite source, namely a battery, and therefore it is particularly important that the energy stored in that battery is used efficiently, especially in such applications as electric vehicles where the battery size itself is limited. Therefore there is a requirement for a highly efficient power control switch.

The recent development of the insulated gate bipolar transistor (IGBT) overcomes the inefficiency associated with the large drive current required for conventional bipolar transistors. However, another power loss associated with bipolar transistors, both conventional and IGBTs, in pulse width modulated applications, is that which arises due to the relatively slow turn-off time of typically 500 ns or more. During this period the voltage across the switching element increases while current continues to pass, especially if there is a high inductance in the circuit, as there would be if the load was, for example, an electric motor. The power dissipated in the transistor is the product of its voltage and current. It will be readily appreciated that the efficiency of the bipolar transistor will decrease as the frequency increases due to the increase in the number of switching transitions. The problem is therefore compounded by the desirability in many applications to drive the power control switch at a frequency outside the range of human hearing, i.e. above 20 kHz.

One solid state switching device which has a considerably faster turn-off time than the IGBT is a metal oxide semiconductor field effect transistor (MOSFET), which has a turn-off time of approximately 20 ns. However, compared with the IGBT, it has a considerable resistance while in its "on" state. In addition high current handling MOSFETs are expensive and require high volume heat sinks. To overcome the problems associated with the relatively slow switching time of the IGBT, it has been proposed in an article by Matthew Carter, published in PCIM Europe May/June 1991 pages 150–156, to connect in parallel an IGBT and MOSFET (shown in FIG. 15 of the article). The MOSFET is controlled such that it conducts for approximately 300 ns after the IGBT turns off such that there is no voltage across the IGBT during the period when the free electron density is decaying. In this arrangement the IGBT handles the conduction losses which are minimized by the IGBT having a low resistance, whereas the MOSFET handles switching losses which are minimized by the MOSFET having a relatively short switching time of approximately 20 ns. This combination of IGBT and MOSFET is also disclosed in European Patent Application No. 0502715.

SUMMARY OF THE INVENTION

According to the present invention there is provided a power control switch comprising: a power input; a power output; a first solid state switching element connected between the power input and power output; a second solid state switching element having a high resistance and fast turn-off time relative to the first switching element connected in parallel with the first switching element between the power input and power output; a control signal input; and switch control means responsive to a control signal for variably controlling the relative operation of each switching element, wherein the power transmitted through the power control switch is pulse width modulated and for each pulse the switch control means turns off the first switching element and then turns off the second switching element after a guard period determined by the switch control means in dependence on the control signal.

Employing the present invention provides a means of controlling the guard period, that is the period between the first switching element switching off and the second switching element switching off. This control enables the guard period to be minimized, maximizing the power transmitted through the first, lower resistance, switching element, and thereby maximizing efficiency of the switch especially at low duty cycles or very high frequencies where the guard period becomes a significant proportion of the duty cycle. The present invention enables the operating frequency to be increased by a factor of between 2 to 5 over a switch comprising IGBTs alone, for a given power. Additionally a significant saving in cost, and the volume required for heat sinking is achieved over a switch comprising MOSFETs alone.

The second switching element, due to it having a higher resistance, normally limits the power handling capability of the switch. By employing the present invention it is possible to minimize the guard period, the period in which the second switching element is conveying all the current, and therefore to have currents passing through the power control switch which significantly exceed the maximum sustainable current through the second switching element, because these currents will only momentarily pass through the second switching element. A switch in accordance with the present invention is particularly advantageous where in use the maximum current through the switch exceeds the maximum sustainable current through the second switching element. Since larger currents than those normally sustainable can be passed through the second switching element, correspondingly cheaper elements, having a lower current rating, can be employed.

Preferably the first switching element is an insulated gate bipolar transistor (IGBT) or alternatively a metal oxide semiconductor controlled thyristor (MCT) as both of these have a low resistance value in their "on" state.

Preferably the second switching element is a metal oxide semiconductor field effect transistor (MOSFET) as this device has a comparatively fast switch-off time of approximately 20 ns.

The present invention is particularly advantageous when the switch has an operating frequency greater than 20 kHz, for at frequencies in excess of these (frequencies outside the range of human hearing) the switching losses of conventional switches become very significant.

Advantageously the control means comprises driver circuits respectively associated with each switching element and advantageously the switch control means comprises a field programmable gate array to control the switching elements, the gate array providing a simple means of controlling the switching elements in an appropriate manner dependent on such factors as the duty cycle and application to which the switch is to be put. Preferably the guard period is determined by the logic state of the field programmable gate array.

Advantageously the switch control means further comprises a memory device for setting the field programmable gate array. This enables the field programmable gate array to be set at each power-up of the device and preferably the memory means comprises an erasable programmable read-only memory (EPROM) as this enables the memory to be reprogrammed for use in different applications. This may be particularly advantageous during initial evaluation of the power control switch for a particular application. Of course, other similar memory devices could be used instead of the EPROM.

Preferably the switch further comprises a plurality of first switching elements connected in parallel and/or a plurality of second switching elements connected in parallel. This enables switching of larger currents or the use of less expensive devices for a given current. It is preferable to select devices with similar switching characteristics by choosing devices which have a similar forward voltage drop for a given operating current.

An electric motor comprising a power control switch in accordance with the present invention is particularly advantageous in that it benefits in having an efficient control means.

According to a second aspect of the invention there is provided a power control switch comprising a solid state switching element and a field programmable gate array (FPGA), wherein the switching element is controlled by the field programmable gate array. This enables the switching element to be variably controlled by the field programmable gate array, and preferably the switch further comprises an erasable programmable read-only memory (EPROM) for programming the field programmable gate array. This enables different logic to be employed by the field programmable gate array depending on application.

BRIEF DESCRIPTION OF THE DRAWINGS

One embodiment of the present invention will now be described by way of example only with reference to the accompanying figures of which:

FIG. 1 schematically illustrates an application of a power switch in accordance with the present invention; and FIG. 2 schematically illustrates in greater detail the components of the power switch of FIG. 1.

DETAILED DESCRIPTION OF THE DRAWINGS

Referring to FIG. 1, a power control switch 1 controls power between a battery 2 and a DC motor 3. The power switch receives a control signal on line 4 indicative of the duty cycle required. This controls the FPGA 5, the state of which is determined by EPROM 6 on initial power-up. The FPGA 5 provides appropriate signals to drivers 7 which control switches 8.

Referring now to FIG. 2, on power-up the EPROM 6 sets the logic within the field programmable gate array 5. The EPROM is programmed depending upon the application to which the power switch is to be applied, for example it will be programmed dependent on the switching frequency required, or the rate of change (slew rate) of the pulse width modulation duty cycle to be allowed.

The FPGA receives a pulse width modulation (PWM) demand on control line 4, which causes latch 9 to provide an appropriate output waveform depending on the PWM demand received.

The FPGA 5 is programmed by the EPROM 6 to perform several functions to the signal output by the latch 9 and these are schematically illustrated by boxes 10 to 13.

The output from the latch 9 follows two lines, the first controlling the first switching element in the form of IGBT 14, and the second controlling the second switching element in the form of MOSFET 15. The control line for the MOSFET comprises a guard time generator 10a which ensures that the MOSFET turns off a short period after the IGBT, the guard time being dependent on the output from latch 9, and the data programmed from the EPROM on power-up.

The control lines for both the MOSFET and IGBT comprise slew rate limit 11 which control the rate at which the duty cycle is changed. This typically would be used in a motor application to limit the acceleration/deceleration of the motor to within the desired levels.

Both control lines also comprise a maximum duty cycle limit which blocks the drive to the MOSFET and sets the IGBT to a permanently "on" state when the duty cycle value is so great that the guard time would extend into the next duty cycle period.

Digital PWM generators 13 provide appropriate signals to buffers 16 and 17 which convert the duty cycle value to pulse width modulator drive signal of fixed frequency to the IGBT 14 and MOSFET 15. The width of each pulse being proportional to the duty cycle demand.

The output from buffers 16 and 17 is received by opto-isolators 18 and 19 in driver circuitry 20 which control amplifiers 21, 22 providing the drive signals to the IGBT 14 and MOSFET 15 respectively. The IGBT 14 and MOSFET 15 are connected in parallel between the DC energy source 2 and load 3 of FIG. 1.

In operation the power switch runs at a frequency determined by the EPROM 6, which in a typical application would be in the range 25–50 kHz. At the start of each cycle both the MOSFET 15 and IGBT 14 switch on simultaneously, the IGBT 14 taking approximately 95% of the current, which in total may be up to 300 amps at 300 V giving a maximum power capability of 90 kW. After a certain percentage of the cycle, determined by the PWM demand, the IGBT 14 switches off such that substantially all the current is momentarily conducted by the MOSFET 15 which switches off after a guard period of the order of 0.75 μs to 2 μs dependent on switching frequency and duty cycle. The guard period is carefully controlled such that the MOSFET 15 switches off as soon as possible after the IGBT 14 to limit the period during which MOSFET 15 carries the high current, for if the guard period is too long the MOSFET 15 will burn out due to the excess current through it. Conversely, the guard period cannot be too short for if there are still free electrons in the IGBT when the MOSFET switches off then a large current spike will be experienced by the IGBT and therefore power consumed by it, reducing its efficiency. If either of these characteristics are detected, the EPROM and FPGA can be reprogrammed accordingly. A power switch in accordance with the invention, when optimally adjusted, is found to be over 99% efficient for the frequency and power ranges given.

Although in the accompanying figures IGBT 14 and MOSFET 15 are schematically shown as single devices, in practice these may each comprise a number of IGBTs or MOSFETs respectively connected in parallel. The number being determined by the maximum current to be conducted. The MOSFETs or IGBTs are selected to ensure they have similar switching characteristics. This is achieved by selecting devices which have a similar forward voltage drop for a given operating current.

What I claim is:

1. A high power control switch comprising:

a power input;

a power output;

a first solid state switching element connected between the power input and the power output;

a second solid state switching element having a high resistance and a fast turn-off time relative to the first switching element connected in parallel with the first switching element between the power input and the power output;

a control signal input; and switch control means responsive to a control signal applied to said control signal input for variably controlling the relative operation of each switching element, wherein the power transmitted through the power control switch is pulse width modulated and for each pulse the switch control means switches the first and second switching elements "on" at substantially the same time and subsequently turns "off" the first switching element and then turns "off" the second switching element after a guard period.

2. The switch, according to claim 1, wherein in use the maximum current through the switch exceeds the maximum sustainable current through the second switching element.

3. The switch, according to claim 1, wherein in use the switch operates at a frequency above the range of human hearing.

4. The switch, according to claim 1, wherein the first switching element is an insulated gate bipolar transistor (IGBT).

5. The switch, according to claim 1, wherein the first switching element is a metal oxide semiconductor controlled thyristor (MCT).

6. The switch, according to claim 1, wherein the second switching element is a metal oxide semiconductor field effect transistor (MOSFET).

7. The switch, according to claim 1, having an operating frequency greater than 20 kHz.

8. The switch, according to claim 1, wherein the switch control means comprises respective driver circuits respectively associated with each switching element.

9. The switch, according to claim 1, wherein the guard period varies with the duty cycle.

10. The switch, according to claim 1, further comprising a plurality of first switching elements connected in parallel, said first switching elements being selected to have substantially the same voltage drop for a given operating current.

11. The switch, according to claim 1, further comprising a plurality of second switching elements connected in parallel, said switching elements being selected to have substantially the same voltage drop for a given operating current.

12. The switch, according to claim 1, wherein the switch control means further comprises a field programmable gate array (FPGA) to control the switching elements.

13. The switch, according to claim 12, wherein the guard period is determined by the logic state of field programmable gate array.

14. The switch, according to claim 13, wherein the switch control means further comprises a memory device for setting the field programmable gate array.

15. The switch, according to claim 14, wherein the memory means comprises an erasable programmable read only memory (EPROM).

\* \* \* \* \*